United States Patent
Takahashi

(10) Patent No.: US 6,448,832 B1
(45) Date of Patent: Sep. 10, 2002

(54) VARIABLE DELAY CIRCUIT

(75) Inventor: Yasuhiko Takahashi, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/036,463

(22) Filed: Jan. 7, 2002

Related U.S. Application Data

(62) Division of application No. 09/843,795, filed on Apr. 30, 2001, now Pat. No. 6,346,843, which is a division of application No. 09/431,050, filed on Nov. 1, 1999, now Pat. No. 6,265,903, which is a division of application No. 08/996,767, filed on Dec. 23, 1997, now Pat. No. 5,990,714.

(30) Foreign Application Priority Data

Dec. 26, 1996 (JP) .......................................... 08-348353
Jan. 20, 1997 (JP) .......................................... 09-008021

(51) Int. Cl.⁷ .............................................. H03H 11/20
(52) U.S. Cl. ........................ 327/270; 327/271; 327/272; 327/288
(58) Field of Search ................................. 327/261, 264, 327/268, 270, 271, 272, 278, 284, 285, 288, 290, 295, 296, 337

(56) References Cited

U.S. PATENT DOCUMENTS

| | | | | |
|---|---|---|---|---|
| 4,506,171 A | * | 3/1985 | Evans et al. .................... 327/87 |
| 4,656,371 A | * | 4/1987 | Binet et al. ..................... 327/77 |
| 4,837,466 A | * | 6/1989 | Kanauchi ...................... 327/31 |
| 5,036,230 A | * | 7/1991 | Bazes .......................... 327/107 |
| 5,087,829 A | | 2/1992 | Ishibashi et al. ............. 327/452 |
| 5,097,159 A | * | 3/1992 | Seki et al. .................... 327/263 |
| 5,245,223 A | * | 9/1993 | Lim et al. ...................... 327/80 |
| 5,355,038 A | * | 10/1994 | Hui ............................. 327/277 |
| 5,497,263 A | * | 3/1996 | Masuda et al. .............. 327/278 |
| 5,506,534 A | * | 4/1996 | Guo et al. .................... 327/276 |
| 5,541,538 A | * | 7/1996 | Bacrania et al. ............... 327/77 |
| 5,581,207 A | * | 12/1996 | Bazes .......................... 327/261 |
| 5,592,116 A | * | 1/1997 | Bedouani ..................... 327/276 |
| 5,731,725 A | * | 3/1998 | Rothenberger .............. 327/262 |
| 5,731,727 A | * | 3/1998 | Iwamoto et al. ............. 327/281 |
| 5,764,092 A | | 6/1998 | Wada et al. ................. 327/271 |
| 5,790,612 A | | 8/1998 | Chengson et al. ........... 327/373 |
| 5,852,380 A | | 12/1998 | Yamauchi .................... 327/243 |
| 5,859,554 A | * | 1/1999 | Higashisaka et al. ........ 327/281 |
| 5,936,451 A | * | 8/1999 | Phillips et al. ............... 327/285 |
| 5,949,292 A | * | 9/1999 | Fahrenbruch et al. ......... 331/57 |
| 5,990,714 A | * | 11/1999 | Takahashi ....................... 327/7 |
| 6,154,100 A | * | 11/2000 | Okamoto ....................... 331/57 |
| 6,265,903 B1 | * | 7/2001 | Takahashi .................... 327/149 |
| 6,097,233 A1 | * | 8/2001 | Schneider et al. ........... 327/281 |

* cited by examiner

*Primary Examiner*—Timothy P. Callahan
*Assistant Examiner*—Hai L. Nguyen
(74) *Attorney, Agent, or Firm*—Connolly Bove Lodge & Hutz LLP

(57) ABSTRACT

In an high-frequency LSI chip, a clock signal generating circuit which establish accurate synchronism between an input clock signal and an internal clock signal to prevent an input circuit to cause a synchronization shift. The clock signal generating circuit includes an input circuit for amplifying an input signal and outputting an amplified signal as a first internal signal; a variable delay circuit, on the basis of a control signal, for delaying the first internal signal and outputting a delayed signal as a second internal signal; a phase comparator for finding a phase difference between the input signal and second internal signal and outputting a phase difference signal indicative of the phase difference; and a control circuit for generating the control signal on the basis of the phase difference signal. Thereby the influences of a delay caused by the input circuit, which would not be able to be avoided in the prior art, can be avoided and thus the accurate internal clock signal can be generated.

4 Claims, 9 Drawing Sheets

VARIABLE DELAY CIRCUIT

CROSS-REFERENCE TO RELATED APPLICATIONS

This application is a divisional application of U.S. patent application Ser. No. 09/843,795, filed Apr. 30, 2001 now U.S. Pat. No. 6,346,843, now allowed, which is a divisional of U.S. patent application Ser. No. 09/431,050 filed Nov. 1, 1999 now U.S. Pat. No. 6,265,903, now allowed, which is a divisional application of U.S. patent application Ser. No. 08/996,767, filed Dec. 23, 1997, that matured into U.S. Pat. No. 5,990,714, issued Nov. 23, 1999.

BACKGROUND OF THE INVENTION

1. Field of the Invention

The present invention relates to clock signal generating circuits and more particularly, to a clock signal generating circuit which can be suitably made in the form of a semiconductor integrated circuit and can operate with a small-amplitude signal having a high frequency, and also to a phase comparator and variable delay circuit which are used in the clock signal generating circuit.

2. Description of the Related Art

As a microprocessor or a semiconductor integrated circuit (LSI) including a semiconductor memory and so on is demanded to operate with a higher frequency, a system clock for synchronization between LSI chips or an internal clock for synchronization between circuits within the respective LSI chips has been increasingly required in recent years to have a higher frequency.

In order to synchronize such an external clock as a system clock supplied from an external LSI chip with such an internal clock for the internal circuits of the LSI chip, a phase locked loop (PLL) circuit is employed. The PLL circuit functions to control a frequency of an oscillator on the basis of a difference in phase between two frequencies. The operation of a prior art PLL circuit will be briefly explained with use of a block diagram of FIG. 1.

The illustrated PLL circuit includes an input circuit 1 for receiving an external clock signal Clkin, a phase comparator 10 for comparing the external clock signal with an internal clock signal with respect to their phase, a loop filter 8 for filtering a phase difference comparison voltage signal received from the phase comparator 10 to generate a control voltage signal, and a voltage controlled oscillator (which will be referred to merely as the VCO, hereinafter) 9 for controlling a frequency on the basis of the control voltage signal received from the loop filter 8. An internal clock signal generated by the voltage controlled oscillator 9 is applied to the phase comparator 10 as a signal PLL1.

In this case, the external clock signal Clkin received from an external clock signal input terminal 5 is first amplified by the input circuit 1 into such a signal as usable in the PLL circuit. The phase comparator 10 compares the amplified signal with the internal clock signal generated at the VCO 9 with respect to their phase and sends its comparison result to the VCO 9 via the loop filter 8.

In the phase comparison the signals Clkin and PLL1, if the signal Clkin is lagging the signal PLL1 with respect to phase, then the value of the control voltage signal generated by the loop filter 8 is increased to increase the frequency of the output signal of the VCO 9. If the signal PLL1 is leading the signal Clkin, then the frequency of the output signal of the VCO 9 is controllably decreased so as not to produce a phase shift between the signals Clkin and PLL1.

Further, a delay locked loop (DLL) circuit is used to synchronize the signal Clkin with a rising edge of the next clock delayed by one cycle. The DLL circuit, which operates in a similar manner to the PLL circuit, is provided with a delay line for delaying the input signal by just one cycle. That is, the DLL circuit is provided to provide a delay corresponding to one cycle of the synchronizing operation, and its allowable frequency range is limited.

In this way, the LSI chip is designed to correct the phase difference between the external and internal clocks with use of the PLL or DLL circuit to transmit an accurate signal. Meanwhile, as the operational frequency of the LSI is increased in these years, the amplitude of the signal has been decreased. Accordingly, when it is desired to use an external signal in an internal circuit, it becomes necessary for the input circuit 1 to perform its amplifying operation, which causes a processing delay in the input circuit 1. Further, even a signal passing through a wiring line connected from an input terminal to the input circuit will be delayed.

Furthermore, the operational speed of the LSI chip is influenced by the chip surrounding environment so that, for example, temperature or voltage value will cause the oscillation frequency of an oscillator to vary or the operation per se of the input circuit to be delayed.

SUMMARY OF THE INVENTION

It is therefore an object of the present invention to provide a clock signal generating circuit in an LSI chip operating at a high frequency, which can establish accurate synchronism between external and internal clocks to reduce a synchronization shift caused by an environmental change.

Another object of the present invention is to provide a clock signal generating circuit which set a delay in a variable delay circuit with use of a binary code to realize adjustment of a fine delay in an internal clock.

In accordance with an aspect of the present invention, the above objects are attained by a signal generation circuit which comprises an input circuit for amplifying an input signal and outputting an amplified signal as a first internal signal; a variable delay circuit, on the basis of a control signal, for delaying the first internal signal and outputting a delayed signal as a second internal signal; a phase comparator for finding a phase difference between the input signal and second internal signal and outputting a phase difference signal indicative of the phase difference; and a control circuit for generating the control signal on the basis of the phase difference signal.

Since the signal generation circuit of the present invention is arranged as mentioned above, a phase difference between, e.g., external and internal clock signals can be compared without any intervention of the input circuit and thus the influences of delay caused by the input circuit can be eliminated.

Further, even for a signal having a high frequency and a small amplitude, its phase comparison can be carried out accurately.

The phase comparator usable in the above signal generation circuit includes differential input means including first transistors having an input clock signal applied to their gates and second transistors having a reference voltage signal applied to their gates for outputting a voltage indicative of a difference between the input clock signal and reference voltage signal; first switching transistors connected in series with the first transistors for receiving at their gates an internal clock signal for comparison with the input clock signal; and second switching transistors connected in series with the second switching transistors for receiving at their gates the internal clock signal.

In accordance with another aspect of the present invention, there is provided a signal generation circuit which comprises an input circuit for amplifying an input signal; a first variable delay circuit for delaying an output signal of the input circuit; a second variable delay circuit for delaying an output signal of the first variable delay circuit by one of first and second durations; a phase comparator circuit for finding a phase difference between the input signal and an output signal of the second variable delay circuit; and control means for controlling the second variable delay circuit to cause a delay time of the second variable delay circuit to switch between the first and second durations and also for controlling the first and second variable delay circuits to cause a phase of the input signal to always coincide with a phase of the output signal of the second variable delay circuit on the basis of an output of the phase comparator circuit.

The second variable delay circuit alternately switches between a zero delay and a one-period delay corresponding to one period of the input clock signal. Alternately applied to the phase comparator circuit are a clock signal subjected to a delay of one period by the first variable delay circuit and a clock signal delayed 2-periods by the first and second variable delay circuits. When the delay of the second variable delay circuit corresponds accurately to the zero delay or one-period delay, a shift in the input phase of the phase comparator circuit is caused only by the first variable delay circuit. For this reason, the delay of the second variable delay circuit is first set, the delay of the first variable delay circuit is controlled to adjust the phase, the delay of the second variable delay circuit is controllably set at the one-period delay to adjust the phase. The control means performs its controlling operation in such a manner that the phase of the input clock signal always coincides with the phase of the clock signal delayed one-period by the first variable delay circuit. Accordingly, even when a change in temperature, etc. causes a change of the delay of the second variable delay circuit, the delay of the second variable delay circuit is controlled to cause the above feedback loop to suppress the phase variation.

One of the variable delay circuits usable in the above signal generation circuit integrates a current supplied from a variable current supply circuit on the basis of an input clock signal to generate an output clock signal corresponding to a delay of the input clock signal; which variable delay circuit comprises a master transistor; and a group of slave transistor pairs connected in plural series including first and second slave transistors connected at their gates to the master transistor and at their sources and drains connected in series, first select transistors for complementarily short-circuiting the sources and drains of the first slave transistors, second select transistors for complementarily short-circuiting the sources and drains of the second slave transistors, for changing operational patterns of the first and second select transistor pairs to switch their output currents to thereby control a delay of the output clock signal.

In the variable delay circuit, the slave transistor pairs in the slave transistor pair group can be made associated with bits of a binary code for simply setting the delay.

Another one of the variable delay circuits usable in the above signal generation circuit comprises an integrated current control part and an integrating circuit part for integrating a current supplied from the integrated current control part on the basis of an input clock signal for generating an output clock signal corresponding to a delay of the input clock signal. In this case, the integrating circuit part includes driving transistors for receiving the current from the integrated current control part; capacitive means for storing therein electric charge by the driving transistors; and gate potential correcting means connected to gates of the driving transistors and having a capacitance corresponding substantially to one of capacities between gates and sources of the driving transistors and between gates and drains thereof, for changing a gate potential of the driving transistors in an opposite direction in response to a change in a potential at a junction point between the driving transistors and capacitive means.

Accordingly, even a small delay caused by the temperature of an LSI chip or by the internal circuit thereof can be cancelled and, in particular, in a high-speed integrated circuit, accurate synchronization can be established.

DESCRIPTION OF THE PREFERRED EMBODIMENTS (First Embodiment)

Figure 2:
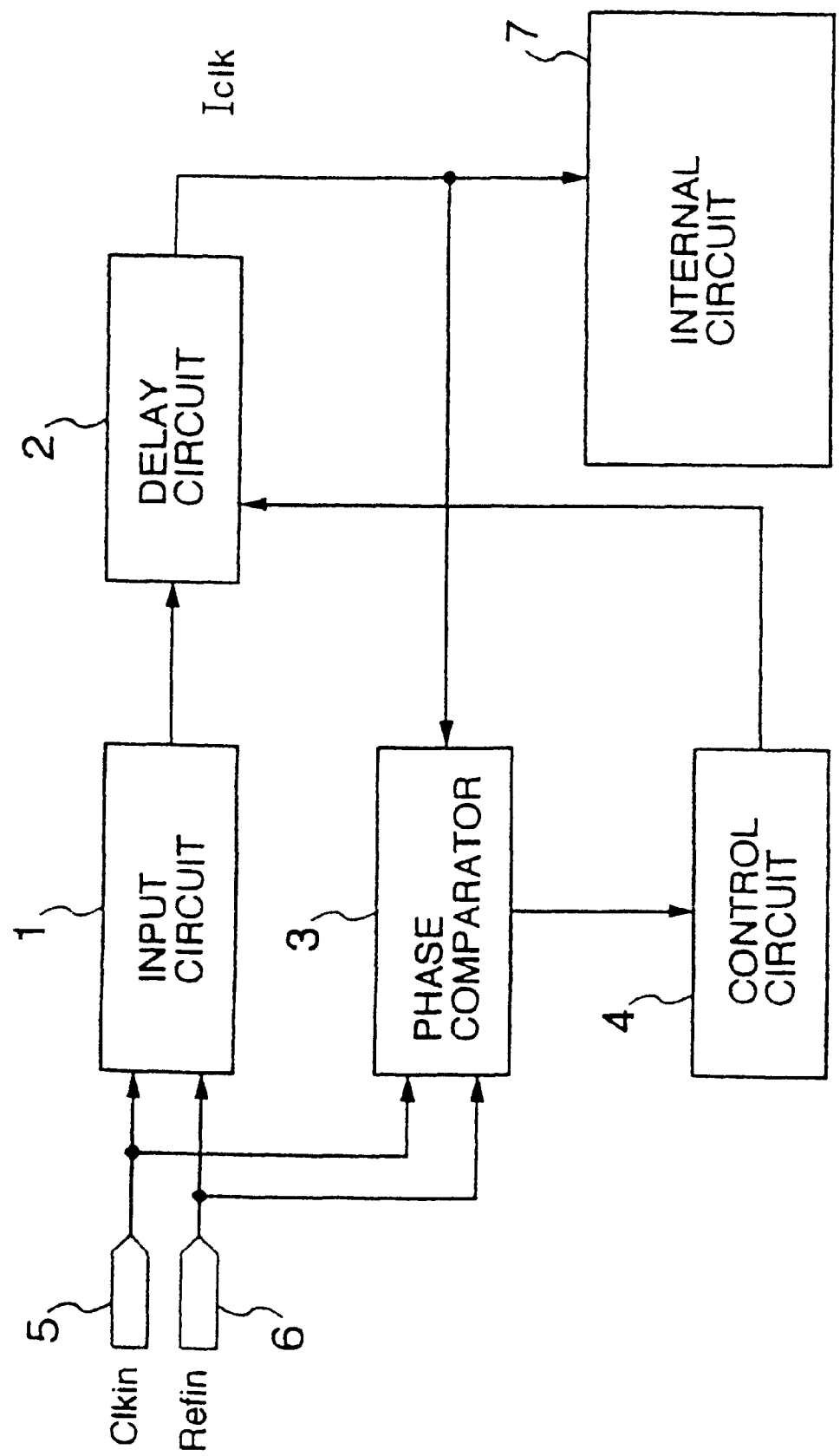
FIG. 2 is a block diagram of a signal generation circuit in accordance with an embodiment of the present invention.

FIG. 2 is a block diagram of a signal generation circuit in accordance with a first embodiment of the present invention. The signal generation circuit of the present embodiment comprises an external clock signal input terminal 5 for receiving an external clock signal Clkin as an input, a reference voltage input terminal 6 for receiving a reference voltage signal Refin as an input, an input circuit 1, a delay circuit 2, a phase comparator 3, and a control circuit 4. May be included in the signal generation circuit is an internal circuit 7 which uses the above internal clock signal. The phase comparator 3 is provided to establish synchronism between the external clock signal Clkin and an internal clock signal Iclk for use in the internal circuit, for which end a suitable delay is given by the delay circuit 2.

The external clock signal Clkin received from the external clock signal input terminal 5 is first amplified by the input circuit 1. In recent LSI chips, signal amplitude is suppressed to a small level to allow a signal to be transmitted at a high frequency. Thus, in order to obtain such a voltage as handleable in a digital circuit, the above amplification is carried out. The amplification of the input circuit 1 involves a slight delay. In the prior art phase comparison circuit, phase comparison has been carried out under the influence of the delay generated in the input circuit 1.

An output signal of the input circuit 1 amplified and slightly delayed therein is delayed by a suitable amount by the delay circuit 2. The delay circuit 2 is considered to be one of various types, but a programmable delay circuit is employed as the delay circuit 2 in this example. The programmable delay circuit is such a circuit that the circuit can provide an arbitrary delay width when receiving an external control signal, thereby adjusting, for example, a clock to be suitable for the internal circuit 7 and so on in the latter stage. A control signal for controlling the delay in the programmable delay circuit is received from the control circuit 4. The above control signal is generated based on the external clock signal Clkin, reference voltage signal Refin and internal clock signal Iclk. An output signal of the delay circuit 2 having a suitable delay is sent not only to the internal circuit 7 as the internal clock signal Iclk but also to the phase comparator 3 to be later explained.

The external clock signal Clkin received from the external clock signal input terminal 5 is applied to the above input circuit 1 and at the same time, directly to the phase comparator 3. As mentioned above, the internal clock signal having the suitable delay as the output of the delay circuit 2 is also applied to the phase comparator 3.

Figure 3:
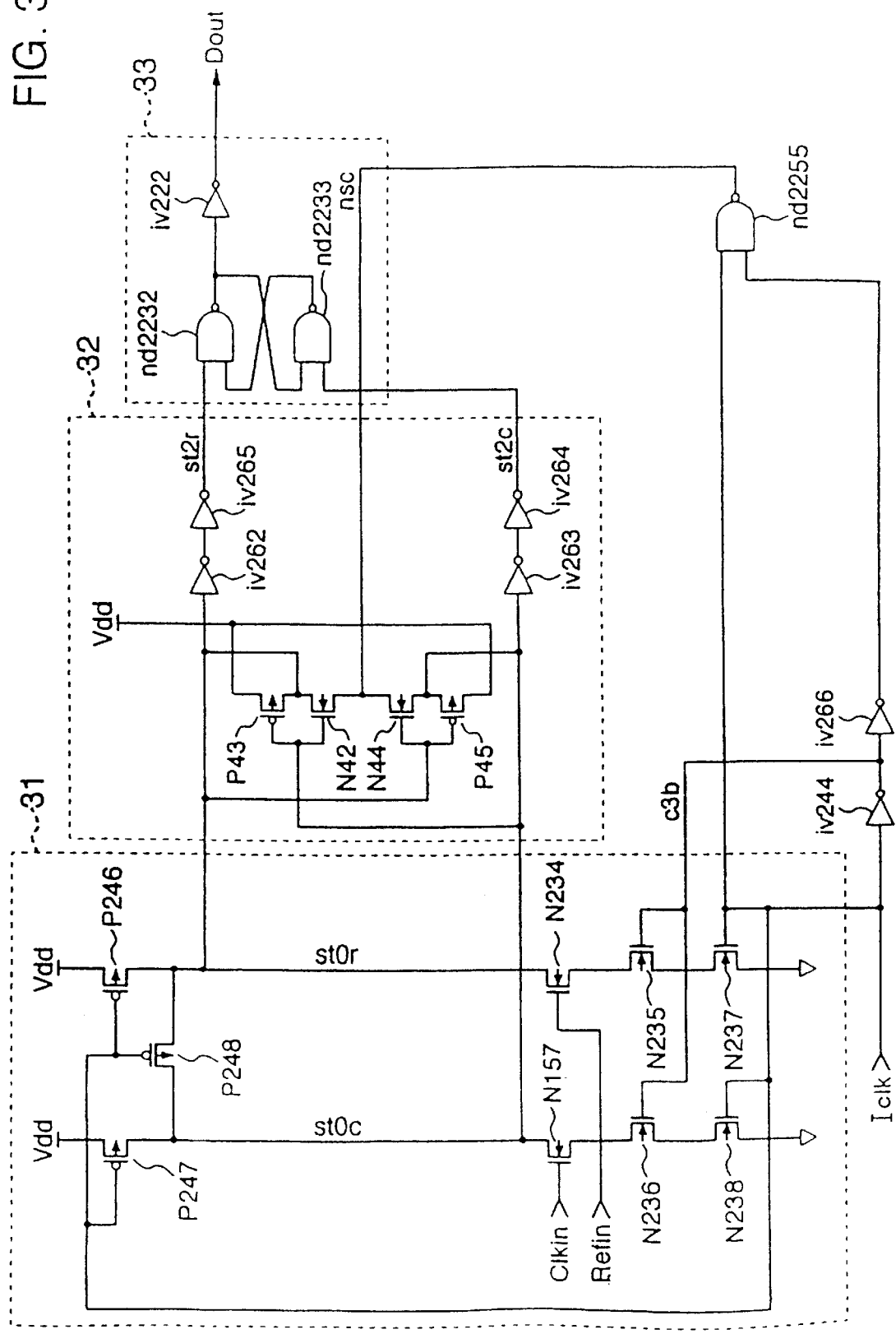
FIG. 3 is a circuit diagram of a phase comparator used in the signal generation circuit of FIG. 2.

The reference voltage signal Refin received from the reference voltage input terminal 6, on the other hand, is also applied directly to the phase comparator 3. The external clock signal Clkin, internal clock signal Iclk and reference voltage signal Refin applied to the phase comparator 3 are processed and output by such a phase comparator circuit 3 as shown in FIG. 3. More in detail, the phase comparator of FIG. 3 includes an integrating circuit 31, a sense amplifier 32 and a latch circuit 33. The operation of the circuit of FIG. 3 will be explained.

A transistor N157 receiving the external clock signal Clkin as well as a transistor N234 receiving the reference voltage signal Refin perform their charging and discharging operations over parasitic capacitances such as capacitances between their gate and drain in response to the operations of PMOS transistors P246, P247 and P248. Although NMOS transistors have been used as the input transistors in FIG. 3, the present invention is not limited to the specific example but may use P and N types depending on the signal level.

First, integral nodes st0c and st0r are precharged to Vdd by the PMOS transistors P246, P247 and P248 when the internal clock signal Iclk is at its low level (L).

Next, when the internal clock signal Iclk changes from its L to high level (H), the precharged PMOS transistors P246, P247 and P248 are all turned OFF, whereas transistors N237 and N238 are turned ON. However, the NMOS transistors N235 and N236 are driven by a signal c3b obtained by inverting the internal clock signal Iclk by an inverter iv244, so that, when the internal clock signal Iclkn changes from its L to H level, the signal c3b is changed from its H to L level, whereby the transistors N235 and N236 are turned OFF.

When the inverter iv244 is now set so that the output signal falls relatively slowly, the internal clock signal Iclk and the signal c3b have both their H state of very short periods, during which the transistors N157 and N234 cause integral nodes st0c and st0r to be discharged respectively according to their input voltages.

After the integrating operation is completed, the sense amplifier 32 amplifies a delicate potential difference between the integral nodes st0c and st0r up to a logical level. The sense amplifier is made up of two sets of inverter circuits, which inputs are connected to the nodes st0c and st0r and which outputs are connected to nodes st2r and st2c respectively. Each inverter circuit is driven toward its L level when its input voltage is close to Vdd; whereas, it is driven toward Vdd when the input voltage is close to its L level.

Accordingly, when the voltage at the node st0r is closer to Vdd than the voltage at the node st0c, an output of the inverter circuit having the node st0r as its input is driven more toward its L level than that having the node st2c as its input.

In this case, an NAND gate nd2255 acts to control the driving duration of the sense amplifier during only the H level period of the internal clock signal Iclk.

Meanwhile, since data latching is carried out by NAND flip flops provided at the latter stage, a low level input may cause latching of an intermediate value data due to a signal delay. To avoid this, the illustrated inverter circuit includes two stages of inverters iv262, iv265, and iv263, iv264. The first stage of inverters iv262 and iv263 are set to have a very low logical threshold, while the second stage of inverters iv264 and iv265 are set to have a high logical threshold, thus preventing the L level input when latching of the intermediate value may be caused. As a result, it can be ensured that, when the signal changes from its H to L level or from its L to H level, the latched output can change only after the L or H level was fully established.

In this way, the external clock signal Clkin received from the external clock signal input terminal 5 is applied to the input circuit 1 and at the same time, also to the phase comparator 3 for direct phase comparison, whereby the internal clock signal is generated while avoiding the influence caused by the delay of the input circuit 1.

With the circuit of FIG. 3, the external clock signal Clkin and reference voltage signal Refin are smaller in their amplitude than the internal clock signal Iclk. The internal clock signal Iclk is a general logical level signal, whereas the external clock signal Clkin and reference voltage signal Refin are transistor-transistor-level (TTL) level signals. For this reason, when these 2 clock signals are compared, in the prior art, the external clock signal Clkin and reference voltage signal Refin are usually amplified up to the logical level signals for phase comparison. However, the above amplification involves a delay, disabling its correct phase comparison. In accordance with the present invention, however, the external clock signal Clkin and reference voltage signal Refin are used as gate inputs of the differential input circuit (integrating circuit), and the internal clock signal Iclk is supplied to the gates of the switching transistors connected in series with transistors of the differential input circuit, whereby the transistors of the differential input circuit can operate to compare the both clock signals with respect to phase regardless of the signal amplitude.

An output signal of the signal generation circuit amplified therein and indicative of the phase difference is used as a clock for internal circuits of the latter stage. The internal circuits include, for example, a DRAM in a semiconductor memory circuit. In the internal circuit, there can be generated such an internal clock signal Iclk that is synchronized with the external clock signal Clkin and also has a sufficient amplitude.

As has been explained in the foregoing, in accordance with the present embodiment, the externally-applied clock signal is used for direct phase comparison, so that the delay influence of the input circuit, which would not able to be avoided in the prior art, can be avoided and such an accurate internal clock signal can be generated.

Further, since the phase difference is once converted to the fine potential difference of the integrating nodes and then amplified by the sense amplifier, there can be avoided such a situation that the phase comparator or phase detector used in the prior art logic circuit cannot detect a small phase difference due to the gate delay, and thus there can be obtained such a phase comparator that can operate independently of the logic speed (frequency).

(Second Embodiment)

Figure 4:
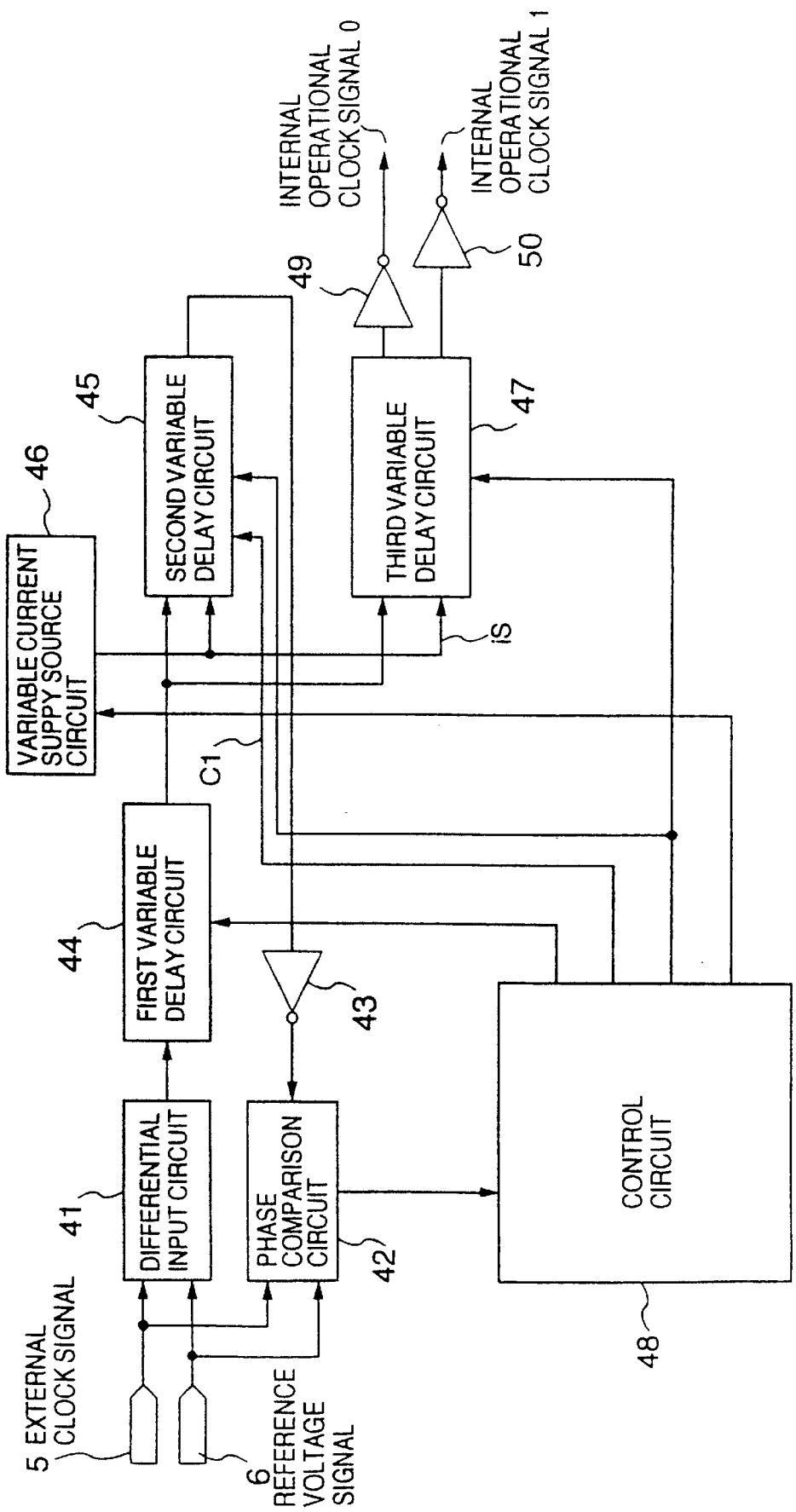
FIG. 4 is a block diagram of a signal generation circuit in accordance with a second embodiment of the present invention.
Figure 5:
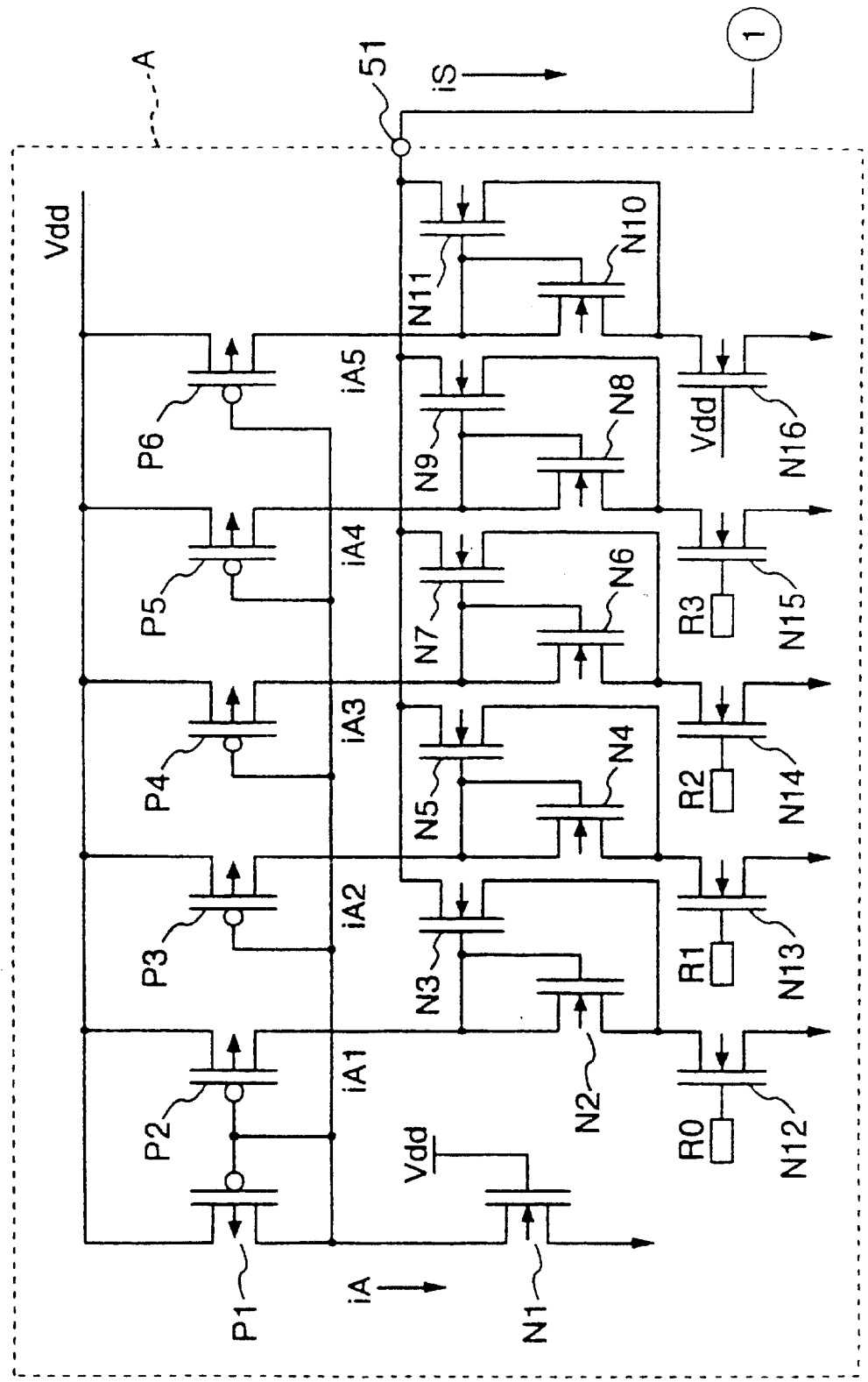
FIG. 5 is a circuit diagram of a variable current supply circuit used in the signal generation circuit of FIG. 4.
Figure 6:
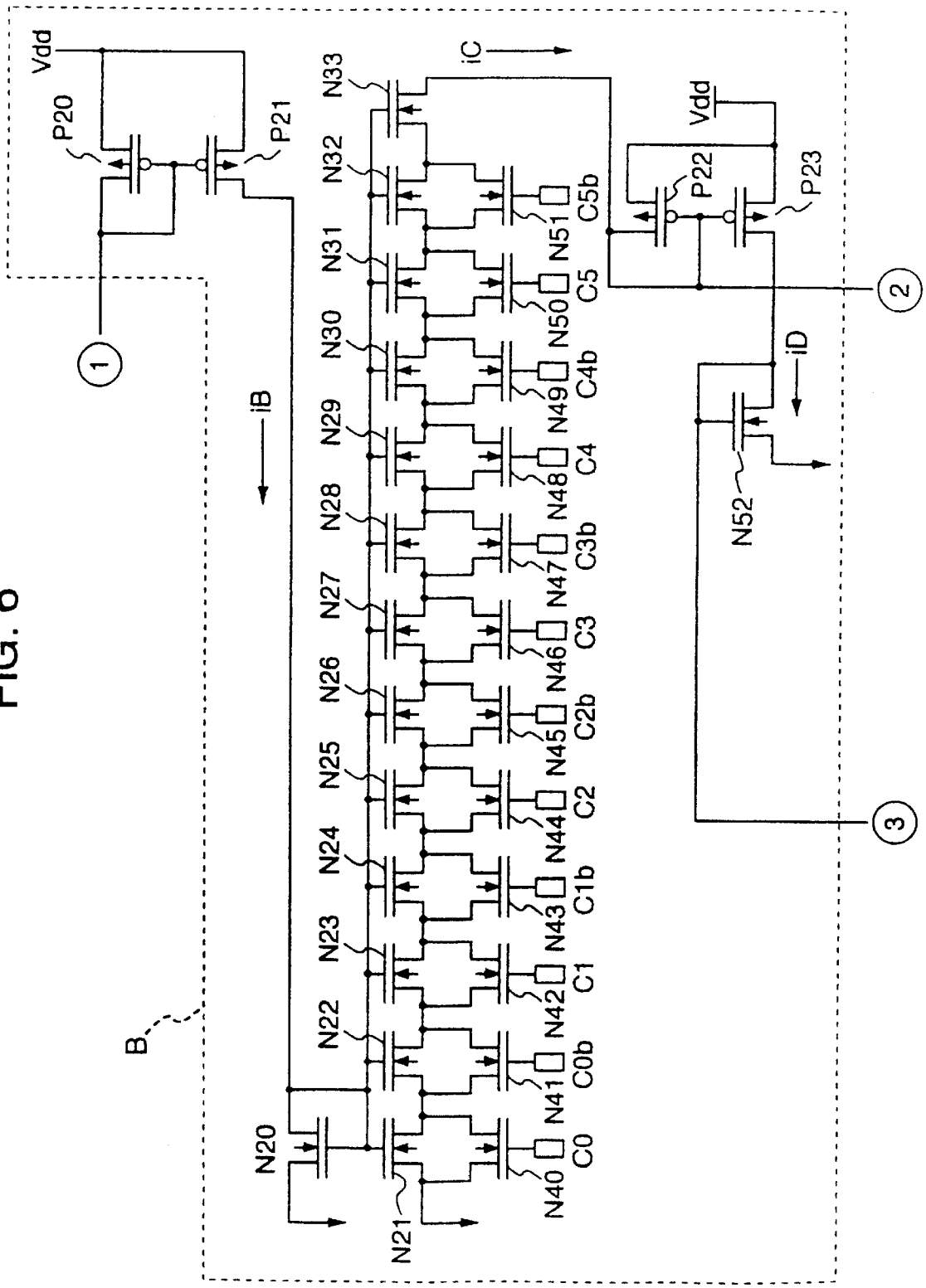
FIG. 6 is an integrated current control circuit used in the signal generation circuit of FIG. 4.
Figure 7:
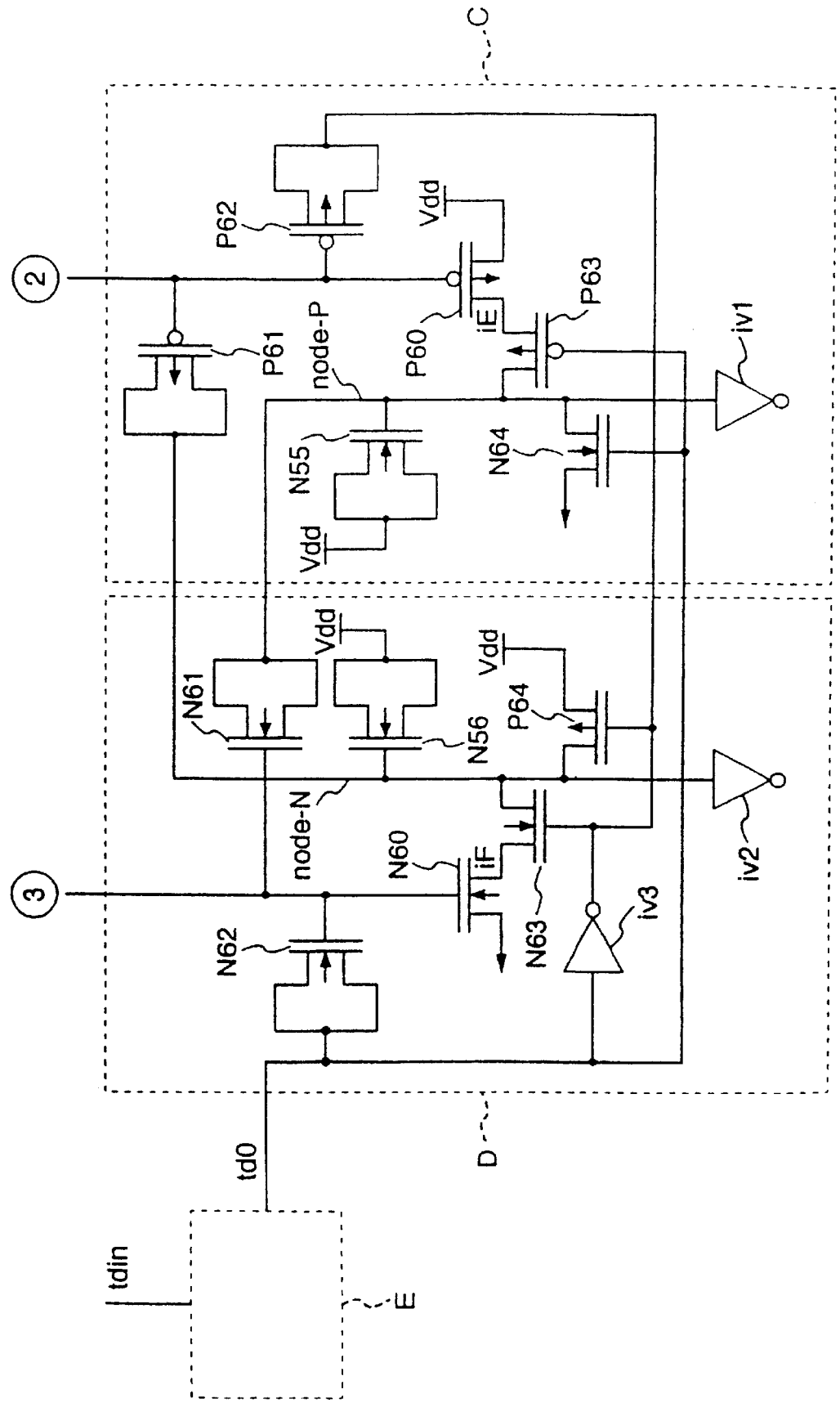
FIG. 7 is an integrating circuit used in the signal generation circuit of FIG. 4.

Explanation will be made as to a second embodiment of the present invention by referring to the accompanying drawings. FIG. 4 is a schematic block diagram of a signal generation circuit in accordance with the second embodiment of the present invention, and FIGS. 5 to 7 show, in detail, a variable current supply circuit, second and third variable delay circuits used in the signal generation circuit, respectively. In FIGS. 5 to 7, a point (1) in FIG. 5 is connected to a point (1) in FIG. 6, a point (2) in FIG. 6 is connected to a point (2) in FIG. 8, and a point (3) in FIG. 6 is connected to a point (3) in FIG. 7, respectively.

The signal generation circuit of FIG. 4 comprises an input terminal 5 to which an external clock signal is applied, an input terminal 6 to which a reference voltage signal is applied, a differential input circuit 41 for comparing the external clock signal and reference voltage signal to generate a clock signal, first and second variable delay circuits 44 and 45 connected in series for delaying an output of the differential input circuit 41, an inverter 43, a phase comparison circuit 42 for comparing a phase of the external clock signal a phase of an output of the second variable delay circuit 45, a control circuit 48 for generating a control signal for control of delays of the variable delay circuits 44 and 45 on the basis of an output signal of the phase comparison circuit 42, a variable current supply source circuit 46 for changing its output current according to the control signal received from the control circuit 48, and a third variable delay circuit 47 for generating an internal clock signal. The variable delay circuits 45 and 47, which are connected to the variable current supply source circuit 46, function to change their delays according to the output current of the variable current supply source circuit 46. Details of the variable current supply source circuit 46 and variable delay circuits 45 and 47 will be explained later with reference to FIGS. 5 to 7.

In the present embodiment, the internal clock signal generated by the third variable delay circuit 47 is extracted through inverters 49 and 50 as internal operation clock signals 0 and 1. The internal operation clock signals 0 and 1 are used, for example, as clock signals for operation of a memory per se.

Figure 1:
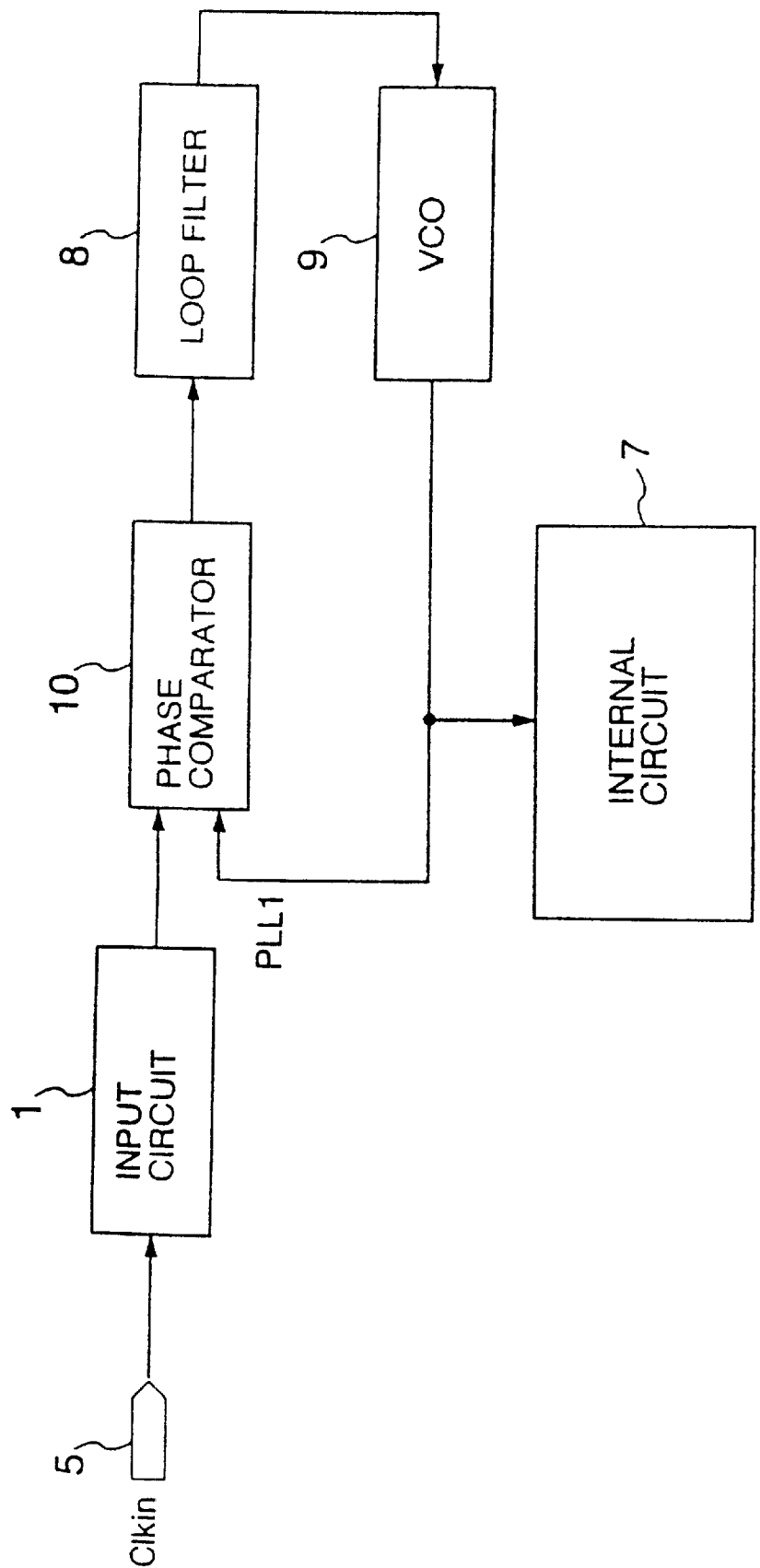
FIG. 1 is a block diagram of a prior art clock signal generating circuit.

In FIG. 4, the external clock signal applied to the external clock signal input terminal 5 is amplified by the differential input circuit 41 to such a voltage that can be handled in a digital circuit. In the case of recent LSI chips, their signal amplitude is suppressed to a small level for the purpose of transmitting the signal at high frequency, for which purpose the differential input circuit 41 is used to amplify the external clock signal to such an amplitude as sufficiently usable in the chip. In this connection, the amplification of the signal by the differential input circuit 41 causes generation of a delay in the clock signal. In the prior art phase comparison circuit shown in FIG. 1, its phase comparison was carried out under the influence of the delay generated in the differential input circuit.

An output signal of the differential input circuit 41 amplified thereby and slightly-delayed is delayed by a suitable amount by next-stage delay circuits. In the present embodiment, the variable delay circuits 44, 45 and 47 are provided for that purpose. The second variable delay circuit 45 is arranged to switch between a zero delay that the phase of an output signal of the first variable delay circuit 44 is not delayed at all and a one-period delay that the phase of the output signal is delayed by 100%, i.e., by an amount of one period.

Although the second variable delay circuit has been explained to delay its delay amount by a zero or one period in the foregoing, it is impossible to realize a perfect zero delay in a practical circuit. Thus alternate change-over of the second variable delay circuit between the zero and one-period delays practically means to switch between "minimum delay" and "minimum delay plus one period". Further, the delay of the first variable delay circuit by one period practically means to delay by the "minimum delay plus one period".

The first variable delay circuit 44 acts, when the second variable delay circuit 45 provides a zero delay, to adjust its delay in such a manner that the clock signal applied to the phase comparison circuit 42 is delayed by a just one period relative to the external clock signal. Therefore, when the second variable delay circuit 45 provides a one-period delay, the clock signal applied to the phase comparison circuit 42 has a delay of just two periods relative to the external clock signal.

The clock signal synchronization is carried out in the following procedure.

(Step 1): A control signal C1 is used to set the second variable delay circuit 45 at a zero delay. And the first variable delay circuit 44 is controlled to adjust its delay in such a manner that rising or falling edges of the clock signal issued from the second variable delay circuit 45 coincide with those of the external input clock signal. More in detail, the phase is controlled to be advanced or delayed little by little in such a direction that the phase difference decreases, and this procedure is repeated until both the input phases coincide with each other.

(Step 2): The control signal C1 is used to adjust the second variable delay circuit 45 and to set the phase shift at 100%. The output current of the variable current supply source circuit 46 is controlled to adjust the delay of the second variable delay circuit 45 in such a manner that the output clock signal of the second variable delay circuit 45 is in phase with the external input clock signal with a lag of just two periods. In such a condition including the lag of two periods, rising or falling edges of the output clock signal of the second variable delay circuit 45 coincide with those of the external input clock signal.

The above steps 1 and 2 are alternately repeated until synchronism is established between the external and internal clock signals.

The third variable delay circuit 47, which has exactly the same configuration as the second variable delay circuit 45, acts to perform integrating operation over the current received from the variable current supply source circuit 46. As shown in FIG. 4, the delay of the third variable delay circuit 47 is set by exactly the same control signal as in the second variable delay circuit 45. Accordingly, in a feedback loop including the input terminals 5 and 6, differential input circuit 41, variable delay circuits 44 and 45, inverter 43 and phase comparison circuit 42 in FIG. 4; modification of a phase shift of the second variable delay circuit 45 causes automatic adjustment of a phase shift of the third variable delay circuit 47.

Detailed explanation will next be made as to the variable current supply source circuit 46 and variable delay circuits 45 and 47 by referring to FIGS. 5 to 7.

The variable current supply source circuit 46 adjusts the delays of the variable delay circuits 45 and 47, and is also used as a current supply circuit of internal circuits in the latter stage. In FIG. 5, a block A is a span controller which corresponds to the variable current supply source circuit 46 in FIG. 4. The variable delay circuits 45 and 47 in FIG. 4 are respectively made up of blocks B, C and D in FIGS. 6 and 7. The block B is an integrated current control circuit for controlling the integrated current, that is, for changing the integrated current to change the delay time. The blocks C and D are integrating circuits including integrators. A block E is a circuit for controlling the clock signal which is output from the first variable delay circuit 44 and is to be applied to the blocks C and D. The circuit of the block E including an RS flip flop is made by a well-known technique.

The span controller A of FIG. 5 controls the span (width between maximum and minimum delays) of a clock signal per se having n periods. The span controller A includes PMOS transistors P1 to P6 and NMOS transistor N1 to N16. In the illustrated example, the NMOS transistors N12 to N16 are switching transistors. The PMOS transistors P2, P3, P4, P5 and P6 are commonly connected at their gates to the gate of the PMOS transistor P1, and form first current mirror circuits together with the PMOS transistor P1. These first current mirror circuits act to cause the same currents iA1 to iA5 to flow through the above current paths as a predetermined current iA flowing through a current path from the PMOS transistor P1 to the NMOS transistor N1.

The NMOS transistors N2 and N3, N4 and N5, N6 and N7, N8 and N9, and N10 and N11 respectively form second current mirror circuits. Output currents of the first current mirror circuits are superimposed through the second current mirror circuits and then output to an output terminal 51 as an output current.

The output currents of the first current mirror circuits vary depending on gate voltages of the NMOS transistors N12, N13, N14 and N15 connected to the respective second current mirror circuits. An on/off signal is supplied from the control circuit 48 to the gates of the NMOS transistors N12, N13, N14 and N15.

At this time, since the gate voltage of the NMOS transistor N16 is fixed at Vdd, the second current mirror circuit of the NMOS transistor N10 and N11 determines a current value when 0 (zero) input is applied from the control circuit 48 to all terminals R0 to R3. The then current value corresponds to the minimum delay controllable by the span controller A. Meanwhile, the NMOS transistors N12, N13, N14 and N15 are connected at their gates to the control circuit 48 of FIG. 4 through the respective terminals R0, R1, R2 and R3. The maximum delay controllable by the span controller A corresponds to the output current when voltages at the terminals R0 to R3 are controlled to turn ON all the NMOS transistors N12, N13, N14 and N15.

In this way, the span controller A can switch an output current iS in the form of 4 bits, i.e., in 16 stages in response to ON/OFF signals applied to the terminals R0 to R3. Further, the output current iS can be linearly changed by switching signals applied to the terminals R0 to R3.

The output current iS of the span controller A is input to an integrated current control circuit B of the variable delay circuit. Since this variable delay circuit constitutes an integrator, the delay time is inversely proportional to a reciprocal of the value of the integrated current. That is, assuming that the NMOS transistor N55 or N56 in the latter stage has an electrostatic capacity C and the inverter iv1 or iv2 has a logical threshold V, then the amount Q of charge is written as follows.

$$Q=CV$$

And a current I for charging the elestrostatic capacity C is expressed as follows.

$$I=Q/t$$

Hence, in order to make a set value of the delay proportional to the delay time, the current is required to be a reciprocal of the set value. This is implemented by fifth current mirror circuits made up of an NMOS transistor N20 and respective NMOS transistors N21 to N32 and N33.

The integrated current controller B of FIG. 6 includes 3 current mirror circuits, i.e., third, fourth and fifth current mirror circuits. The third current mirror circuit, which is made up of the PMOS transistors P20 and P21, functions to adjust a current to be supplied to the fifth current mirror circuit. This causes a current iB corresponding to the output current iS from the span controller A to flow from the PMOS transistor P21 to the NMOS transistor N20. The fourth current mirror circuit is made up of the PMOS transistor P22 and P23. This causes a current iD corresponding to an output current iC between the NMOS transistor N33 and PMOS transistor P22 to flow between the PMOS transistor P23 and an NMOS transistor N52.

The fifth current mirror circuits are made of the NMOS transistor N20 (master transistor) and pairs of the NMOS transistor s N21 to N32 and N33 respectively. The NMOS transistor s N21 to N32 and N33 are connected at their gates to the NMOS transistor N20 and at their sources and drains in series therewith. The NMOS transistor N21 to N32 are connected to NMOS transistors N40 to N51 (select transistors) as switching transistors. The NMOS transistors N40 to N51 complementarily provide short-circuiting between the sources and drains of the NMOS transistor N21 to N32. The switching transistors are selectively operated to determine the output current iC.

The even-numbered NMOS transistors N22, N24, N26, N28, N30 and N32 (second slave transistors) comprise transistors having different gate lengths L. In the present embodiment, the gate lengths L of these transistors are set so that the transistor N22 has a smallest gate length and the other transistors have gate lengths sequentially incremented in the order of N24, N26, . . . Meanwhile, the even-numbered NMOS transistors N21, N23, N25, N27, N29 and N31 (first slave transistors) are reference transistors all having an identical minimum gate length Lo. Further, the NMOS transistor N33, which acts to determine the basic operation of the fifth current mirror circuits, has a predetermined gate length $L_1$.

The NMOS transistors N21 to N32 and N33 have all an identical gate width W. The even-numbered NMOS transistors N22, N24, N26, N28, N30 and N32 may be set to have such gate lengths L as sequentially decremented in the order of N22, N24, . . .

The NMOS transistors N40 to N51 perform switching operations between the transistors N22, N24, N26, N28, N30 and N32 for adjustment of the gate length L and the reference transistors N21, N23, N25, N27, N29 and N31. Terminals C0 to C5 are provided for input of signals for the delay control. The voltage Vdd is applied to one of the terminals C0 and C0b, while the voltage Vss is applied to the other. For example, when an OFF signal is applied to the terminal C0 (at this time, an ON signal is applied to the terminal C0b), a current flows through the switching transistor N41 and reference transistor N21. When the ON signal is applied to the terminal C0 (at this time, the OFF signal is applied to the terminal C0b), on the other hand, a current flows through the adjusting transistor N22 and switching transistor N40. At this time, only the adjusting or reference transistor through which the current flows, will form substantially the fifth current mirror circuit. The same holds true for the operation for the terminals C1 to C5 and C1b to C5b. Accordingly, the NMOS transistors N21 and N22, N23 and N24, N25 and N26, N27 and N28, N29 and N30, and N31 and N32 form pairs, either one of each pair of which is always selected and operated.

Of output currents of the fifth current mirror circuits, the minimum current is a current for a total ate length of $6 \times L_0 + L_1$ when the ON voltage is supplied to all the terminals C0 to C5 and the OFF voltage is supplied to all the terminals C0b to C5b, while the maximum current is a current for the total gate length when the OFF voltage is supplied to all the terminals C0 to C5 and the ON voltage is supplied to all the terminals C0b to C5b. A difference current between the minimum and maximum currents can be suitably adjusted by selecting ON and OFF patterns of the NMOS transistors N40 to N51. Even when the switching transistors N40 to N51 are turned ON, this will not contribute to the gate lengths of the fifth current mirror circuits.

In the integrated current control circuit B, since the gates of all the mirror NMOS transistors N21 to N32 and N33 have mirror potentials, the output current iC is inversely proportional to the gate length L. In other words, when predetermined signals are applied to the terminals C0 to C5 and C0b to C5b for change-over of the gate lengths L, the output current iC varies proportionally to 1/L. Accordingly, when the gate length L is set to have a set value, the set value becomes proportional to the delay time. The set value of the gate length L may be controlled in terms of the n-th power of 2. In the present embodiment, for example, the gate length L may be set in terms of the sixth power of 2, that is, in terms of 6 bits. When the terminals C0 to C5 are set to be all zeros (000000), the minimum gate length is obtained; whereas, when the terminal C0 is expressed in terms of "1" and the terminals C1 to C5 are expressed as all zeros (that is, (100000)), the gate length becomes longer than the minimum gate length by a difference between the gate length of the NMOS transistor N22 and that of the reference transistor N21. This results in the fact that the current iC is decreased, the reset or integral time is prolonged, and the delay is increased. When the terminals are set to be (010000) in 6 bits, the gate length becomes longer than the minimum gate length by a difference between the gate length of the NMOS transistor N24 and that of the reference transistor N23; whereas, when the terminal are set to be (110000), the gate length becomes longer than the minimum gate length by a difference between a total gate length of the NMOS transistors N22 and N24 and a total gate length of the reference transistors N21 and N23. In this way, it is particularly advantageous from the viewpoint of digital control that the delay can be set in terms of the n-th power of 2, i.e., in a binary manner.

With the current control circuit B, since the total gate length can be controlled in terms of a unit difference between the gate lengths of 2 or more transistors, setting can be finely realized. In practice, a delay as fine as about 30 ps can be controlled or set. Further, the current control circuit B has such a merit that a design flexibility of its circuit array can be improved over a current control circuit based on gate change-over and conventionally suggested.

A current iD corresponding to an inversion of the current iC obtained by the above current control circuit B is generated by the PMOS transistors P22 and P23.

In FIG. 7, the block C is a charging integrating circuit, while the block D is a discharging integrating circuit. The blocks C and D are formed symmetrically. In the block C, the PMOS transistor P60 forms a sixth current mirror circuit together with the PMOS transistor P22 of the integrated current control circuit B; whereas, in the block D, the NMOS transistor N60 forms a seventh current mirror circuit together with the NMOS transistor N52. These sixth and seventh current mirror circuits are arranged so that an identical current flows through the blocks C and D and thus the two blocks C and D operate symmetrically.

The block C includes a PMOS transistor P60 (driving transistor) driven by a current received from the integrated current control circuit B, an NMOS transistor N55 as a capacitive means, a PMOS transistor P63 (switching transistor) for defining an integration start, a resetting NMOS transistor N64, a PMOS transistor P61 as a first gate potential correcting means, and a PMOS transistor P62 as a second gate potential correcting means. Similarly, the block D includes an NMOS transistor N60 (driving transistor) driven by a current received from the integrated current control circuit B, an NMOS transistor N56 as a capacitive means, an NMOS transistor N63 (switching transistor) for defining an integration start, a resetting PMOS transistor P64, an NMOS transistor N61 as a first gate potential correcting means, and an NMOS transistor N62 as a second gate potential correcting means.

In the block C, the PMOS transistor P60 charges the gate of the NMOS transistor N55 from Vss toward Vdd. In the block D, on the other hand, the NMOS transistor N60 discharges the gate of the NMOS transistor N56 from Vdd toward Vss. Since the two charged/discharged waveforms are controlled by the sixth and seventh current mirror circuits with use of the same current, the waveforms are symmetrical with respect to 0.5 Vdd. That is, the amount of charge is equal to the amount of discharge.

Charging/discharging currents iE and iF, even when the PMOS transistor P60 and NMOS transistor N60 have a perfect constant gate voltage, will not perfectly constant under the influences of voltages at points node P and node N. However, this influences can be relatively suppressed, so long as the voltages are as low as about the logical threshold value (1/2 Vdd) of the inverter acting to monitor completion of the charging/discharging operations.

It is electrostatic capacities (parasitic capacitances) induced between the gates and sources or gates and drains of the PMOS and NMOS transistors P60 and N60 that more largely affects the charging/discharging currents than the above node voltages. The influences of the electrostatic capacities cause the gate voltages of the PMOS and NMOS transistors P60 and N60 to be changed, thus resulting in that the charging/discharging currents iE and iF vary and the waveforms of the charging/discharging currents become non-linear. This is because the voltage of the point node-P causes the gate voltage of the PMOS transistor P60 to increase, while the voltage of the point node-N causes the gate voltage of the NMOS transistor N60 to decrease, with the result that the currents of the transistors both decrease.

In such a case, a charging capacitor is usually placed in a feedback loop of an inverting amplifier to change the charging terminal to a virtual grounding point and to avoid the influence. However, it is hard to realize this method when frequency becomes high and, even if the method became realized, its circuit become complicated. In addition, this method involves such a problem that it cannot cope with high speed operation.

However, when the symmetrical charging/discharging waveforms are generated to achieve balance therebetween as in the present embodiment, the high speed operation can be realized with a simple circuit. In the integrating circuit C, the PMOS transistor P61 is used as the first gate potential correcting means for changing the gate voltage of the PMOS transistor P60 to the contrary direction in response to a change in a potential at a junction point of PMOS and NMOS transistors P60 and N55. In other words, the PMOS transistor P61 acts as a balancer having the same capacitance as the PMOS transistor P60 to generate a voltage waveform in the opposite direction through the balancer capacitor for balance therebetween. The PMOS transistor P61, which are short-circuited between its source and drain, operates as a capacitive element. The PMOS transistor P61 is connected at its gate to the gate of the PMOS transistor P60, and also connected at its source and drain to the source and the source or drain of the NMOS transistor N63 of the integrating circuit D. Further, the gate length of the PMOS transistor P61 is set so that a capacitance between the gate and source (or drain) of the PMOS transistor P61 becomes nearly equal to a capacitance between the gate and source (or drain) of the PMOS transistor P60. Similarly, even in the integrating circuit D, the NMOS transistor N61 is used as the first gate potential correcting means for changing the gate voltage of the NMOS transistor N60 in the opposite direction, and acts as a balancer for the NMOS transistor N60.

The above parasitic capacitance problem occurs even for the PMOS and NMOS transistors P63 and N63 acting as the switching transistors. To solve the problem, in the present embodiment, the NMOS and PMOS transistors N62 and P62 are provided as second gate voltage correcting means. The NMOS transistor N62 is short-circuited between its source and drain and operates as a capacitive element. The NMOS transistor N62 is connected at its gate to the gate of the NMOS transistor N60 and also connected at its source and drain to the gate of the PMOS transistor P60. And a capacitance between the gate and source (or drain) of the NMOS transistor N62 is set to be nearly equal to a capacitance between the gate and source (or drain) of the PMOS transistor P63. The NMOS transistor N62 changes the gate voltage of the PMOS transistor P63 in the opposite direction according to a change in a potential at a junction point of the PMOS and NMOS transistors P63 and N55. The PMOS transistor P63 is configured in the similar manner to the above. In this way, the PMOS and NMOS transistors N63 and P63 act as balancers for cancelling the influences of the NMOS and PMOS transistors N63 and P63.

Explanation will then be made as to timing of a series of operations in the integrating circuits C and D. First of all, in an initial state, the charging/discharging currents are previously determined by the blocks A and B. An integral node node-P in the block C is reset at Vss by the resetting NMOS transistor N64. Assume now that the external clock signal is applied to the differential input circuit 41 so that a signal tdin applied to the integrating circuits C and D is at its low (L) level. Then the RS flip flop within the block E is set so that a signal td0 is also at its L level. At this time, the resetting transistors N64 and P64 are turned OFF, the PMOS transistor P60 connected in series with the charging NMOS transistor N55 as well as the NMOS transistor N60 connected in series with the NMOS transistor N56 are turned ON, thus starting the charging/discharging operations. When the respective charging/discharging voltages exceed threshold values of the inverters iv1 and iv2, this causes outputs of the inverters to be inverted and at the same time, causes the RS flip flop to be reset, resulting in the initial state.

Figure 8A:
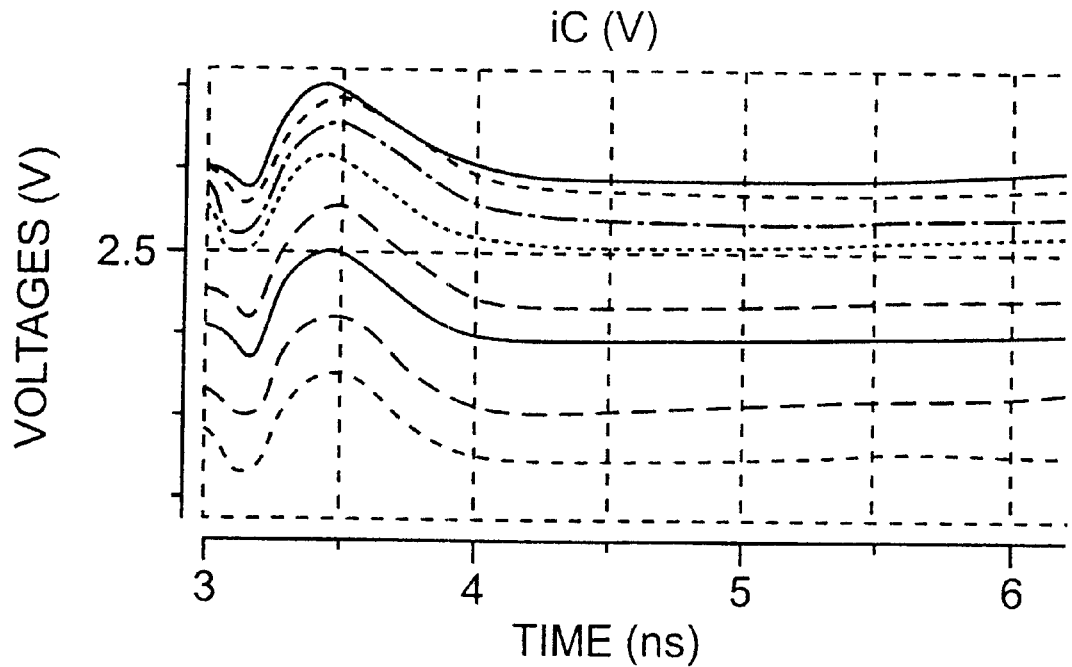
FIGS. 8A to 8D show simulation results of the circuits of FIGS. 5 to 7.
Figure 8B:
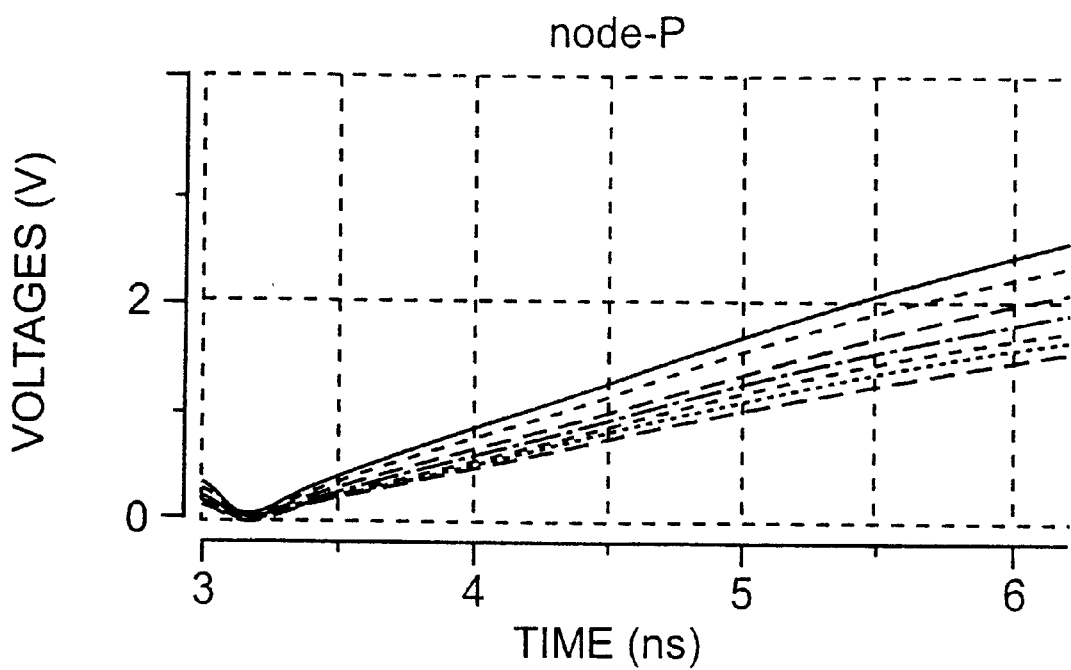
Figure 8C:
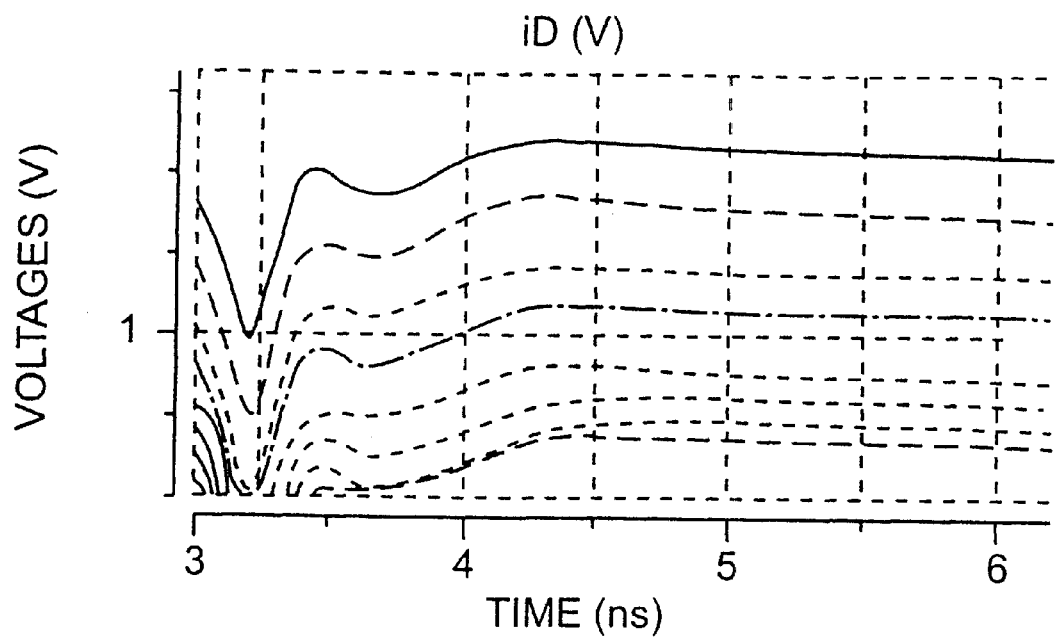
Figure 8D:
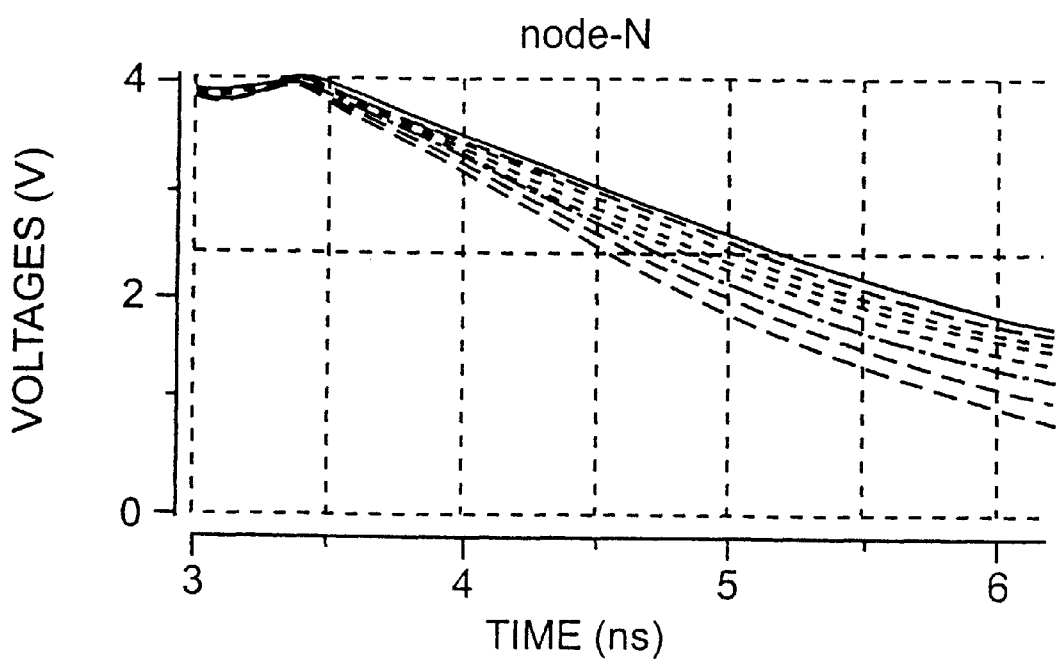

Shown in FIGS. 8A to 8D are simulation results of the circuit of FIGS. 5 to 7. More specifically, FIG. 8A is a graph showing variations in a voltage at a node through which the current iC flows, i.e., variations in the gate voltage of the PMOS transistor P60; FIG. 8B is a graph showing waveforms of the charging voltages at the node node-P; FIG. 8C is a graph showing variations in a voltage at a node through which the current iD flows, i.e., variations in the gate voltage of the NMOS transistor N60; and FIG. 8D is a graph showing waveforms of the discharging voltages at the node node-N. In this case, simulation was carried out in several stages where the set value is changed in the integrated current control circuit B. In these drawings, abscissa denotes time (nsec.) and ordinate denotes voltage (V). As seen from FIGS. 8A and 8B, the gate voltage of the PMOS transistor P60 is nearly constant and stable and a charging waveform thereof varies substantially linearly. Further, it will be seen from FIGS. 8C and 8D that the gate voltage of the NMOS transistor N60 is nearly constant and stable and a discharging waveform thereof varies substantially linearly.

In the present embodiment, the span controller A changes a span in 16 stages of digital steps to thereby control the output current. The integrated current control circuit B, on the other hand, changes the set value of delay in 64 stages of digital steps to thereby control the current. That is, one of features of the present invention lie in that the invention has two input lines of the span and the set value of delay to generate the integrated currents iC and iD and thus a delay.

Explanation will next be made as to how to achieve clock synchronism in the signal generation circuit of the present embodiment. As shown in FIG. 4, first of all, the control circuit 48 sends the control signal C1 to the second variable delay circuit 45 to set a zero delay for the second variable delay circuit 45. At this time, the phase comparison circuit 42 receives the external clock signal and a clock signal subjected to a delay of one period by the first variable delay circuit 44. The control circuit 48, on the basis of a signal received from the phase comparison circuit 42, judges whether the one-period-delayed clock signal leads or lags the external clock signal with respect to their phase, and on the basis of its judgement result, sends a predetermined signal to the first variable delay circuit 44. This causes the first variable delay circuit 44 to increment or decrement the delay in units of a minimum step. In this way, the control circuit 48 establishes phase synchronism between the external clock signal and the clock signal one-period delayed by the first variable delay circuit 44.

Next, the control circuit 48 sends the control signal C1 to the second variable delay circuit 45 to set a delay of one period for the second variable delay circuit 45. At this time, the phase comparison circuit 42 receives the external clock signal as well as a clock signal subjected by a delay of two periods by the first and second variable delay circuits 44 and 45. The control circuit 48, on the basis of the signal received from the phase comparison circuit 42, judges whether the 2-period-delayed clock signal leads or lags the external clock signal with resect to their phase, and on the basis of its judgement result, sends a predetermined signal to the variable current supply source circuit 46. This causes the variable current supply source circuit 46 to adjust the span on the basis of the signal. In this way, the control circuit 48 establishes phase synchronism between the external clock signal and the clock signal 2-periods delayed by the first and second variable delay circuits 44 and 45.

Meanwhile, changing the span by the span controller (variable current supply circuit) also results in a change in the delay. For this reason, the phase of the clock signal adjusted when the zero delay was first set for the first variable delay circuit 44 will be shifted. This might be considered to be a structurally inherent defect of the span controller. To avoid this, in accordance with the present embodiment, such operation as to control the first variable delay circuit 44 to adjust the phase of the clock signals when the second variable delay circuit 45 is set at the zero delay as well as such operation as to control the variable current supply source circuit 46 to adjust the phase of the clock signals when the second variable delay circuit 45 is set at one-period delay are alternately repeated, and the delay of the first variable delay circuit 44 and the current value of the variable current supply source circuit 46 are set, so that a phase shift between the clock signals when the second variable delay circuit 45 is set at the zero delay and at the one-period delay becomes eventually zero. As a result, accurate synchronism can be established between the external and internal clock signals.

The present invention is not limited to the above specific embodiments but may be modified in various ways in the scope and spirit of the subject matter of the present invention.

As has been explained in the foregoing, in the internal clock generation circuits and variable delay circuits in the foregoing embodiments, since not only the transistors are selectively driven by the variable current supply circuit but also the delay is changed on the basis of the direct phase difference with the external clock signal, even a very small delay caused by the temperature of the LSI chip or by the internal circuit can be cancelled and in particular, in a high-speed integrated circuit, accurate synchronism can be established therebetween.

Since not only the control of the clock delay but also the automatic adjustment of the span per se enables control of even a delay randomly generated by the internal input circuit, etc.; the present invention can be suitably applied to a high-frequency integrated circuit.

What is claimed is:

1. A variable delay circuit comprising an integrated current control part and an integrating circuit part for integrating a current supplied from said integrated current control part on the basis of an input clock signal for generating an output clock signal corresponding to a delay of said input clock signal, wherein said integrating circuit part includes:

driving transistors for receiving the current from said integrated current control part;

capacitive means for storing therein electric charge by said driving transistors; and gate potential correcting means connected to gates of said driving transistors and having a capacitance corresponding substantially to one of capacities between gates and sources of said driving transistors and between gates and drains thereof, for changing a gate potential of said driving transistors in an opposite direction in response to a change in a potential at a junction point between said driving transistors and capacitive means.

2. A variable delay circuit as set forth in claim 1, wherein said integrating circuit part includes first integrating part having first transistors of a first conduction type as said driving transistors and also includes a second integrating part operated complementarily with said first integrating part, said second integrating part having second transistors of a second conduction type different from said first conduction type, and wherein a capacitor having a capacitance substantially corresponding to a capacitance between gates and sources of said first transistors is connected as said gate potential correcting means between the gates of said first transistors and sources and drains of said second transistors.

3. A variable delay circuit as set forth in claim 1, wherein each of said first and second integrating parts includes:

switching transistors connected between said driving transistors and capacitive means for receiving at their gates an integrating clock signal; and second gate potential correcting means connected to gates of said driving transistors and having a capacitance corresponding substantially to one of capacities between gates and sources of said driving transistors and between gates and drains thereof, for changing a gate potential of said driving transistors in an opposite direction in response to a change in a potential at a junction point between said driving transistors and capacitive means.

4. A variable delay circuit as set forth in claim 3, wherein said first integrating part has third transistors of said first conduction type as said switching transistors, said second integrating part has fourth transistors of a second conduction type different from said first conduction type, and a capacitor having a capacitance substantially corresponding to a capacitance between gates and sources of said third transistors is connected as said second gate potential correcting means between the gates of said third transistors and gates of said fourth transistors.

* * * * *